(12) United States Patent  
Lee et al.

(10) Patent No.: US 9,146,465 B2  
(45) Date of Patent: Sep. 29, 2015

(54) PHOTOSENSITIVE RESIN COMPOSITION AND COLOR FILTER USING THE SAME

(71) Applicant: Cheil Industries Inc., Gumi-si (KR)

(72) Inventors: Chang-Min Lee, Uiwang-si (KR); Kwang-Won Seo, Uiwang-si (KR); Yeon-Soo Lee, Uiwang-si (KR); Sang-Won Cho, Uiwang-si (KR); Seung-Jib Choi, Uiwang-si (KR); Soo-Young Heo, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 106 days.

(21) Appl. No.: 14/097,560

(22) Filed: Dec. 5, 2013

(65) Prior Publication Data

US 2015/0034886 A1     Feb. 5, 2015

(30) Foreign Application Priority Data

Aug. 2, 2013   (KR) .................. 10-2013-0092104

(51) Int. Cl.
```
G02B 5/23      (2006.01)
G02B 5/22      (2006.01)
G03F 7/033     (2006.01)
```

(52) U.S. Cl.
CPC ............... *G03F 7/033* (2013.01); *G02B 5/223* (2013.01)

(58) Field of Classification Search
USPC ....... 252/582, 586; 257/432; 359/891; 430/7, 430/270.1, 285.1, 286.1, 434; 552/101
See application file for complete search history.

(56) References Cited

U.S. PATENT DOCUMENTS

| | | |
|---|---|---|
| 5,350,731 A | 9/1994 | Williams et al. |
| 5,744,280 A | 4/1998 | Mooney, III et al. |
| 8,282,862 B1 * | 10/2012 | Kim et al. ............ 252/582 |
| 8,906,271 B2 * | 12/2014 | Lee et al. ............ 252/586 |
| 2009/0176095 A1 | 7/2009 | Oguro |
| 2012/0003592 A1 | 1/2012 | Williams et al. |
| 2012/0004310 A1 | 1/2012 | Longo et al. |

FOREIGN PATENT DOCUMENTS

| | | |
|---|---|---|
| EP | 0828182 A1 | 3/1998 |
| JP | 2012-116939 A | 6/2012 |
| JP | 2012-194466 A | 10/2012 |
| JP | 2013-014748 A | 1/2013 |
| KR | 10-2006-0134968 A | 12/2006 |
| KR | 10-2012-0012393 A | 2/2012 |
| KR | 10-2012-0123930 A | 11/2012 |

* cited by examiner

*Primary Examiner* — Bijan Ahvazi
(74) *Attorney, Agent, or Firm* — Additon, Higgins & Pendleton, P.A.

(57) ABSTRACT

A photosensitive resin composition for a color filter includes (A) a dye including a cation moiety represented by the following Chemical Formula 1, wherein in Chemical Formula 1, each substituent is the same as defined in the detailed description; (B) an acrylic-based photopolymerizable monomer; (C) a photopolymerization initiator; (D) an acrylic-based binder resin; and (E) a solvent, and a color filter using the same.

[Chemical Formula 1]

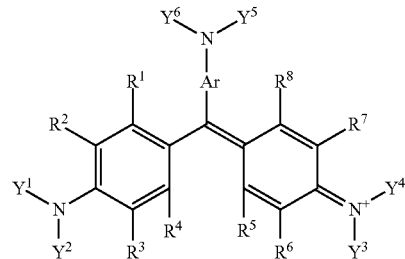

10 Claims, No Drawings

PHOTOSENSITIVE RESIN COMPOSITION AND COLOR FILTER USING THE SAME

CROSS-REFERENCE TO RELATED APPLICATION

This application claims priority to and the benefit of Korean Patent Application No. 10-2013-0092104 filed in the Korean Intellectual Property Office on Aug. 2, 2013, the entire disclosure of which is incorporated herein by reference.

FIELD OF THE INVENTION

This disclosure relates to a photosensitive resin composition for a color filter and a color filter using the same.

BACKGROUND OF THE INVENTION

In general, a color filter is used for a liquid crystal display (LCD), an optical filter for a camera, and the like. A color filter can be manufactured by coating a fine region colored with three or more colors on a charge coupled device or a transparent substrate. Such a colored thin film can be manufactured by dyeing, printing, electrophoretic deposition (EPD), pigment dispersion, and the like.

A process of manufacturing the color filter includes many chemical treatment steps during the manufacturing process. Accordingly, in order to maintain a pattern formed under the aforementioned conditions, a color photosensitive resin is required to have a development margin but chemical resistance to thus improve yield of a color filter.

Particularly, since a color filter of a liquid crystal display device is formed on a TFT array panel using color filter-on-array (COA) method, a process of forming a transparent electrode on a color filter is needed. The transparent electrode may be fabricated by sequentially forming a transparent conductive layer and a photosensitive resin layer on a color filter, exposing and developing and patterning the photosensitive resin layer, and etching the transparent conductive layer with the use of the patterned photosensitive resin layer.

The color filter is required to have a chemical resistance because the color filter may be exposed to diverse liquid chemicals, such as a stripping solution for developing the photosensitive resin layer. The color filter also is required to have a heat resistance because a plurality of heat treatments is required to form the color filter. Therefore, there is a need for a color filter having chemical resistance and heat resistance.

SUMMARY OF THE INVENTION

One embodiment of the present invention provides a photosensitive resin composition for a color filter that can have excellent heat resistance and/or chemical resistance.

Another embodiment of the present invention provides a color filter that can have excellent luminance using the photosensitive resin composition for a color filter.

One embodiment of the present invention provides a photosensitive resin composition for a color filter including (A) a dye including a cation moiety represented by the following Chemical Formula 1; (B) an acrylic-based photopolymerizable monomer; (C) a photopolymerization initiator; (D) an acrylic-based binder resin; and (E) a solvent.

[Chemical Formula 1]

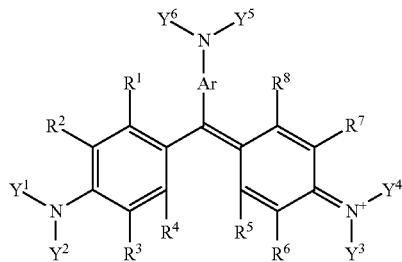

In the above Chemical Formula 1, $R^1$ to $R^8$ are the same or different and are each independently hydrogen, halogen, a nitrile group, a nitro group, a substituted or unsubstituted amine group, substituted or unsubstituted C1 to C30 alkyl, substituted or unsubstituted C3 to C30 cycloalkyl, or substituted or unsubstituted C6 to C30 aryl, Ar is substituted or unsubstituted C6 to C30 arylene, $Y^1$ to $Y^6$ are the same or different and are each independently hydrogen, substituted or unsubstituted acrylate, substituted or unsubstituted C1 to C30 alkyl, substituted or unsubstituted C3 to C30 cycloalkyl, substituted or unsubstituted C2 to C30 heterocycloalkyl, substituted or unsubstituted C6 to C30 aryl, or substituted or unsubstituted C2 to C30 heteroaryl, wherein at least one of $Y^1$ to $Y^6$ is represented by the following Chemical Formula 2.

[Chemical Formula 2]

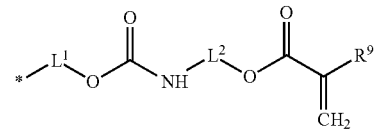

In the above Chemical Formula 2, $L^1$ and $L^2$ are the same or different and are each independently substituted or unsubstituted C1 to C30 alkylene, substituted or unsubstituted C3 to C30 cycloalkylene, or substituted or unsubstituted C6 to C30 arylene, and $R^9$ is hydrogen or substituted or unsubstituted C1 to C30 alkyl.

At least one of the $Y^1$ to $Y^6$ may be represented by the following Chemical Formula 3 in addition to the above Chemical Formula 2.

[Chemical Formula 3]

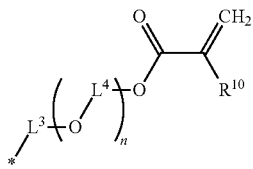

In the above Chemical Formula 3, $L^3$ and $L^4$ are the same or different and are each independently substituted or unsubstituted C1 to C30 alkylene, substituted or unsubstituted C3 to C30 cycloalkylene, or substituted or unsubstituted C6 to C30 arylene, $R^{10}$ is hydrogen or substituted or unsubstituted C1 to C30 alkyl, and n is an integer ranging from 0 to 20.

In exemplary embodiments, at least two of the $Y^1$ to $Y^6$ are selected from the above Chemical Formula 2 and the above Chemical Formula 3, with the proviso that at least one of the $Y^1$ to $Y^6$ is represented by the above Chemical Formula 2.

The dye including the cation moiety represented by the above Chemical Formula 1 may include a dye including a cation moiety represented by the following Chemical Formula 4.

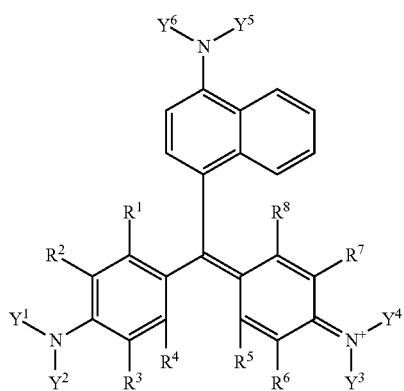

[Chemical Formula 4]

The dye including the cation moiety represented by the above Chemical Formula 1 may include a dye including a cation moiety represented by the following Chemical Formula 5.

The photosensitive resin composition for a color filter may include about 0.1 wt % to about 50 wt % dye including the cation moiety represented by the above Chemical Formula 1 (A); about 0.5 wt % to about 20 wt % of the acrylic-based photopolymerizable monomer (B); about 0.1 to about 10 wt % of the photopolymerization initiator (C); about 0.5 wt % to about 20 wt % of the acrylic-based binder resin (D); and a balance amount of the solvent (E).

The photosensitive resin composition for a color filter may further include at least one colorant (F) including a dye, a pigment, or a combination thereof, wherein the dye is different from the dye including the cation moiety represented by the above Chemical Formula 1.

The colorant (F) may be included in an amount of about 0.1 wt % to about 40 wt % based on total amount (total weight) of the photosensitive resin composition for a color filter.

The photosensitive resin composition for a color filter may further include at least one additive including malonic acid; 3-amino-1,2-propanediol; a coupling agent including a vinyl group and/or a (meth)acryloxy group; a leveling agent; a fluorine-based surfactant; and/or a radical polymerization initiator.

According to another embodiment of the present invention, a color filter manufactured using the photosensitive resin composition for a color filter is provided.

Further embodiments of this disclosure are described in the following detailed description.

The photosensitive resin composition for a color filter can have excellent heat resistance and chemical resistance, and thus may realize a color filter that can have high luminescence characteristics.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" refers to C1 to C20 alkyl, the term

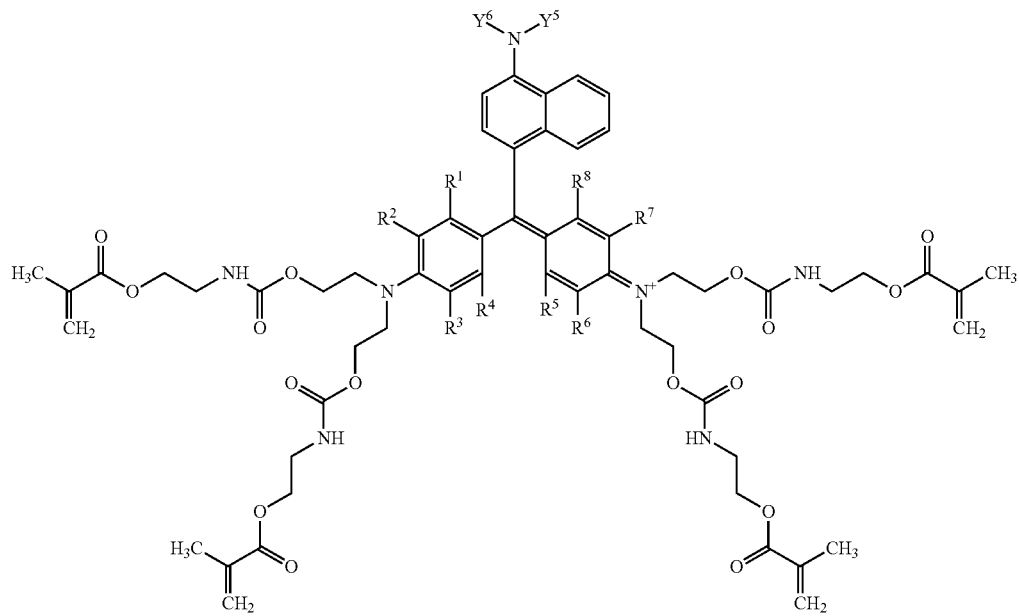

[Chemical Formula 5]

"alkenyl" refers to C2 to C20 alkenyl, the term "cycloalkenyl" refers to C3 to C20 cycloalkenyl, the term "heterocycloalkenyl" refers to C3 to C20 heterocycloalkenyl, the term "aryl" refers to C6 to C20 aryl, the term "arylalkyl" refers to C6 to C20 arylalkyl, the term "alkylene" refers to C1 to C20 alkylene, the term "arylene" refers to C6 to C20 arylene, the term "alkylarylene" refers to C6 to C20 alkylarylene, the term "heteroarylene" refers to C3 to C20 heteroarylene, and the term "alkoxylene" refers to C1 to C20 alkoxylene.

As used herein, when a specific definition is not otherwise provided, the term "substituted" refers to one substituted with halogen (F, Cl, Br, or I), a hydroxy group, a C1 to C20 alkoxy group, a nitro group, a cyano group, an amine group, an imino group, an azido group, an amidino group, a hydrazino group, hydrazono group, a carbonyl group, a carbamyl group, a thiol group, an ester group, an ether group, a carboxyl group or a salt thereof, a sulfonic acid group or a salt thereof, a phosphoric acid or a salt thereof, C1 to C20 alkyl, C2 to C20 alkenyl, C2 to C20 alkynyl, C6 to C20 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C20 heteroaryl, or a combination thereof, in place of at least one hydrogen.

As used herein, when a specific definition is not otherwise provided, the term "hetero" may refer to one substituted with at least one hetero atom including N, O, S, P, or a combination thereof, in place of at least one C in a cyclic substituent.

As used herein, when a specific definition is not otherwise provided, "(meth)acrylate" refers to both "acrylate" and "methacrylate", and "(meth)acrylic acid" refers to "acrylic acid" and "methacrylic acid".

As used herein, when a specific definition is not otherwise provided, the term "combination" refers to a mixture or copolymerization.

As used herein, "*" denotes a position linked to the same or different atom or Chemical Formula.

A photosensitive resin composition for a color filter according to one embodiment includes (A) a dye including a cation moiety represented by the following Chemical Formula 1; (B) an acrylic-based photopolymerizable monomer; (C) a photopolymerization initiator; (D) an acrylic-based binder resin; and (E) a solvent.

The dye including the cation moiety represented by the above Chemical Formula 1 includes at least one functional group represented by the above Chemical Formula 2. This can promote photo-cross-linking reactions between the functional group and the photopolymerizable monomer, and/or between the functional group and acrylic-based binder resin in an exposed part, and thereby the photosensitive resin composition for a color filter including the dye can have improved chemical resistance, heat resistance, and/or the like.

In addition, a negative photosensitive resin generally has weak resistance for a stripper and may contaminate a lower layer due to residues. However, the photosensitive resin composition for a color filter according to one embodiment can have improved stripper resistance due to the dye including the cation moiety represented by the above Chemical Formula 1.

Hereinafter, each component is described in detail.

(A) Dye Including Cation Moiety Represented by Chemical Formula 1

The dye including the cation moiety represented by the following Chemical Formula 1 can promote photo-cross-linking reactions between the functional group and the photopolymerizable monomer, and/or between the functional group and acrylic-based binder resin in an exposed part, due to a functional group represented by the following Chemical Formula 2, that is an urethane acrylate group. Thereby a color filter that can have excellent chemical resistance such as stripper resistance and the like and heat resistance may be provided.

[Chemical Formula 1]

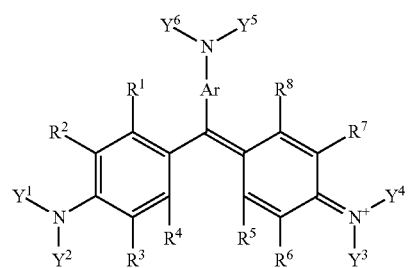

In the above Chemical Formula 1,
$R^1$ to $R^8$ are the same or different and are each independently hydrogen, halogen, a nitrile group, a nitro group, a substituted or unsubstituted amine group, substituted or unsubstituted C1 to C30 alkyl, substituted or unsubstituted C3 to C30 cycloalkyl, or substituted or unsubstituted C6 to C30 aryl, Ar is substituted or unsubstituted C6 to C30 arylene, $Y^1$ to $Y^6$ are the same or different and are each independently hydrogen, substituted or unsubstituted acrylate, substituted or unsubstituted C1 to C30 alkyl, substituted or unsubstituted C3 to C30 cycloalkyl, substituted or unsubstituted C2 to C30 heterocycloalkyl, substituted or unsubstituted C6 to C30 aryl, or substituted or unsubstituted C2 to C30 heteroaryl, wherein at least one of $Y^1$ to $Y^6$ is represented by the following Chemical Formula 2.

[Chemical Formula 2]

In the above Chemical Formula 2,
$L^1$ and $L^2$ are the same or different and are each independently substituted or unsubstituted C1 to C30 alkylene, substituted or unsubstituted C3 to C30 cycloalkylene, or substituted or unsubstituted C6 to C30 arylene, and $R^9$ is hydrogen or substituted or unsubstituted C1 to C30 alkyl.

For example, each $R^1$ to $R^8$ may be independently hydrogen, halogen, or substituted or unsubstituted C1 to C30 alkyl.

For example, each $Y^1$ to $Y^6$ may be independently hydrogen, substituted or unsubstituted acrylate, or substituted or unsubstituted C1 to C20 alkyl.

At least one of the $Y^1$ to $Y^6$ may be represented by the following Chemical Formula 3 in addition to the at least one of the $Y^1$ to $Y^6$ represented by the above Chemical Formula 2.

[Chemical Formula 3]

In the above Chemical Formula 3,

L³ and L⁴ are the same or different and are each independently substituted or unsubstituted C1 to C30 alkylene, substituted or unsubstituted C3 to C30 cycloalkylene, or substituted or unsubstituted C6 to C30 arylene, $R^{10}$ is hydrogen or substituted or unsubstituted C1 to C30 alkyl, and n is an integer ranging from 0 to 20.

In exemplary embodiments, at least two of the $Y^1$ to $Y^6$ are selected from the above Chemical Formula 2 and the above Chemical Formula 3, with the proviso that at least one of the $Y^1$ to $Y^6$ is represented by the above Chemical Formula 2.

The dye may further include an anion moiety. Examples of the anion moiety may include an anion, for example, a halogen ion, boron anion, a phosphoric acid anion, a carboxylic acid anion, a sulfuric acid anion, an organic sulfonic acid anion, a nitrogen anion, a matched anion, and the like, but is not limited thereto.

For example, the anion may be at least one electron withdrawing group (EWG) comprising a halogen (e.g., a fluoro group) and/or a cyano group. In this case, heat resistance of a photosensitive resin composition may be improved.

The anion including at least one electron withdrawing group (EWG) comprising a halogen (e.g., a fluoro group) and/or a cyano group may be an organic sulfonic acid anion including a fluoro group, and may be represented by the following Chemical Formulae A-1 to A-18.

  [A-1]

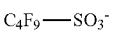  [A-2]

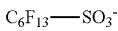  [A-3]

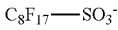  [A-4]

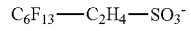  [A-5]

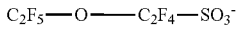  [A-6]

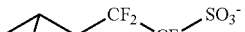  [A-7]

  [A-8]

  [A-9]

  [A-10]

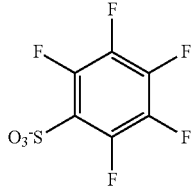  [A-11]

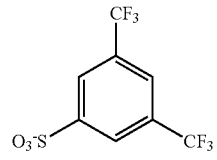  [A-12]

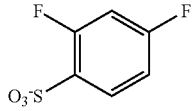  [A-13]

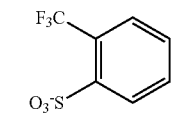  [A-14]

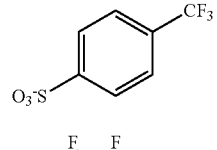  [A-15]

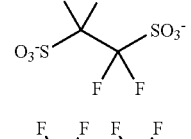  [A-16]

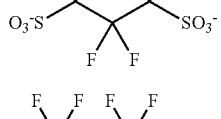  [A-17]

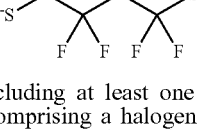  [A-18]

The anion including at least one electron withdrawing group (EWG) comprising a halogen (e.g., a fluoro group) and/or a cyano group may be a nitrogen anion including a fluoro group or a cyano group, and may be [(CN)₂N]⁻, [(FSO₂)₂N]⁻, [(FSO₂)N(CF₃SO₂)]⁻, [(FSO₂)N(CF₃CF₂SO₂)]⁻, [(FSO₂)N{(CF₃)₂CFSO₂}]⁻, [(FSO₂)N(CF₃CF₂CF₂SO₂)]⁻, [(FSO₂)N(CF₃CF₂CF₂CF₂SO₂)]⁻, [(FSO₂)N{(CF₃)₂CFCF₂SO₂}]⁻, [(FSO₂)N{CF₃CF₂(CF₃)CFSO₂}]⁻, [(FSO₂)N{(CF₃)₃CSO₂}]⁻, or represented by the following Chemical Formulae A-19 to A-27.

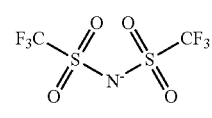  [A-19]

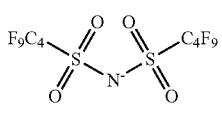  [A-20]

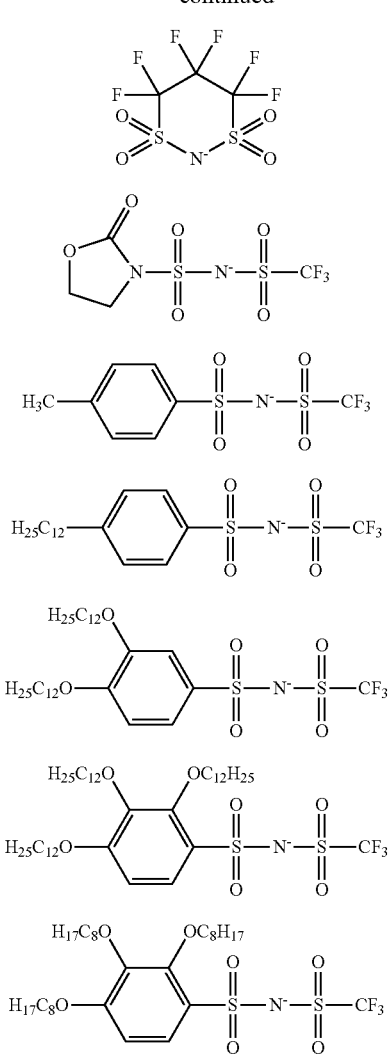

[A-21]

[A-22]

[A-23]

[A-24]

[A-25]

[A-26]

[A-27]

The anion including at least one electron withdrawing group (EWG) comprising a halogen (e.g., a fluoro group) and/or a cyano group may be a phosphoric acid anion including a fluoro group, and may be $PF_6^-$, $(C_2F_5)_2PF_4^-$, $(C_2F_5)_3PF_3^-$, $[(CF_3)_2CF]_2PF_4^-$, $[(CF_3)_2CF]_3PF_3^-$, $(n-C_3F_7)_2PF_4^-$, $(n-C_3F_7)_3PF_3^-$, $(n-C_4F_9)_3PF_3^-$, $(C_2F_5)(CF_3)_2PF_3^-$, $[(CF_3)_2CFCF_2]_2PF_4^-$, $[(CF_3)_2CFCF_2]_3PF_3^-$, $(n-C_4F_9)_2PF_4^-$, $(n-C_4F_9)_3PF_3^-$, $(C_2F_4H)(CF_3)_2PF_3^-$, $(C_2F_3H_2)_3PF_3^-$, $(C_2F_5)(CF_3)_2PF_3^-$.

The anion including at least one electron withdrawing group (EWG) comprising a halogen (e.g., a fluoro group) and/or a cyano group may be a boron anion including a fluoro group and/or a cyano group, and may be $BF_4^-$, $(CF_3)_4B^-$, $(CF_3)_3BF^-$, $(CF_3)_2BF_2^-$, $(CF_3)BF_3^-$, $(C_2F_5)_4B^-$, $(C_2F_5)_3BF^-$, $(C_2F_5)BF_3^-$, $(C_2F_5)_2BF_2^-$, $(CF_3)(C_2F_5)_2BF^-$, $(C_6F_5)_4B^-$, $[(CF_3)_2C_6H_3]_4B^-$, $(CF_3C_6H_4)_4B^-$, $(C_6F_5)_2BF_2^-$, $(C_6F_5)BF_3^-$, $(C_6H_3F_2)_4B^-$, $B(CN)_4^-$, $B(CN)F_3^-$, $B(CN)_2F_2^-$, $B(CN)_3F^-$, $(CF_3)_3B(CN)^-$, $(CF_3)_2B(CN)_2^-$, $(C_2F_5)_3B(CN)^-$, $(C_2F_5)_2B(CN)_2^-$, $(n-C_3F_7)_3B(CN)^-$, $(n-C_4F_9)_3B(CN)^-$, $(n-C_4F_9)_2B(CN)_2^-$, $(n-C_6F_{13})_3B(CN)^-$, $(CHF_2)_3BCN^-$, $(CHF_2)_2B(CN)_2^-$, $(CH_2CF_3)_3B(CN)^-$, $(CH_2CF_3)_2B(CN)_2^-$, $(CH_2C_2F_5)_3B(CN)^-$, $(CH_2C_2F_5)_2B(CN)_2^-$, $(CH_2CH_2C_3F_7)_2B(CN)_2^-$, $(n-C_3F_7CH_2)_2B(CN)_2^-$, or $(C_6H_5)_3B(CN)^-$.

The anion including at least one electron withdrawing group (EWG) comprising a halogen (e.g., a fluoro group) and/or a cyano group may be a matched anion including a fluoro group, and may be $((CF_3SO_2)_3C^-$, $(CF_3CF_2SO_2)_3C^-$, $[(CF_3)_2CFSO_2]_3C^-$, $(CF_3CF_2CF_2SO_2)_3C^-$, $[(CF_3)_2CFCF_2SO_2]_3C^-$, $[CF_3CF_2CF_2CF_2SO_2]_3C^-$, $(CF_3)CFSO_2]_3C^-$, $[(CF_3)_3CSO_2]_3C^-$, $(FSO_2)_3C^-$.

When the dye including the cation moiety represented by the above Chemical Formula 1 further includes the anion moiety, the dye may be represented by the following Chemical Formula 6.

[Chemical Formula 6]

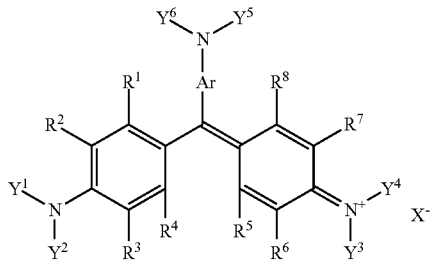

In the above Chemical Formula 6, each substituent, linking group, and the like are the same as in the above Chemical Formula 1, and $X^-$ is the above anion.

The dye including the cation moiety represented by the above Chemical Formula 1 may include a dye represented by including a cation moiety represented by the following Chemical Formula 4.

[Chemical Formula 4]

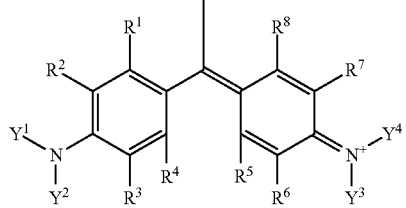

In the above Chemical Formula 4, each substituent, linking group, and the like are the same as in the above Chemical Formula 1

When the dye including the cation moiety represented by the above Chemical Formula 4 further includes the anion moiety, the dye may be represented by the following Chemical Formula 7.

[Chemical Formula 7]

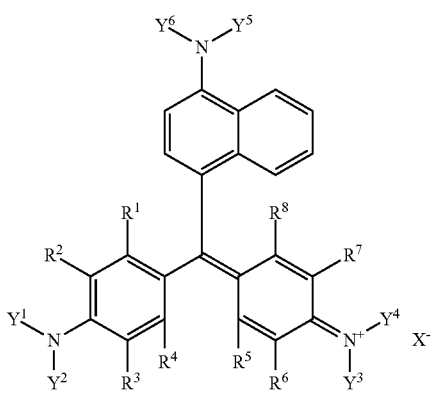

In the above Chemical Formula 7, each substituent, and the like are the same as in the above Chemical Formula 1, and X⁻ is the above anion.

The dye including the cation moiety represented by the above Chemical Formula 1 may be a dye represented by including a cation moiety represented by the following Chemical Formula 5.

In the above Chemical Formula 8, each substituent, and the like are the same as in the above Chemical Formula 1, and X⁻ is the above anion.

The photosensitive resin composition may include the dye including the cation moiety represented by the above Chemical Formula 1 in an amount of about 0.1 to about 50 wt %, for example about 1 to about 30 wt %, based on the total amount

[Chemical Formula 5]

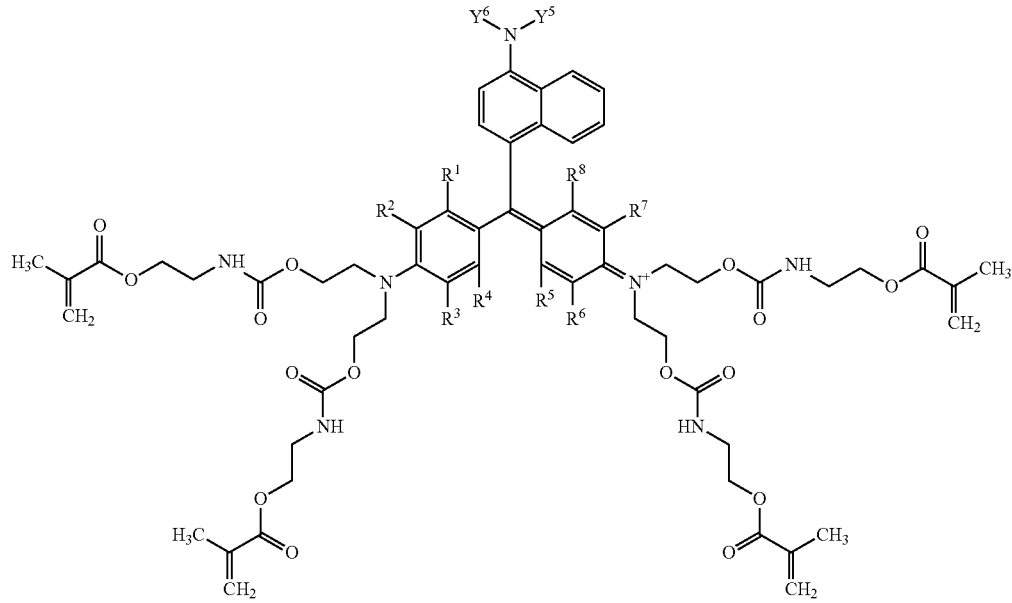

In the above Chemical Formula 5, each substituent, and the like is the same as in the above Chemical Formula 1.

When the dye including cation moiety represented by the above Chemical Formula 5 further includes the anion moiety, the dye may be represented by the following Chemical Formula 8.

(total weight) of the photosensitive resin composition for a color filter. In some embodiments, the photosensitive resin composition may include the dye including the cation moiety represented by the above Chemical Formula 1 in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24,

[Chemical Formula 8]

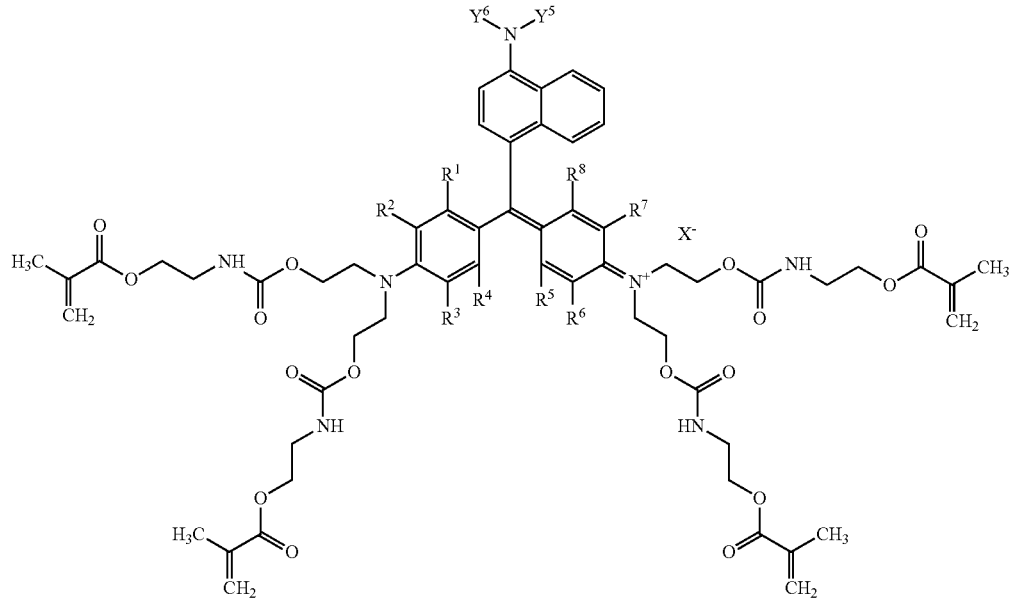

25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the dye including the cation moiety represented by the above Chemical Formula 1 can be in a range from about any of the foregoing amounts to about any other of the foregoing amounts.

When the dye is included in an amount within the above range, developability for an alkali developing solution can be improved, surface roughness can be reduced due to excellent cross-linking, a pattern may not be pulled out due to improved chemical resistance, and the color may not be changed even in an organic solvent.

The extent of photo-cross-linking (cross-linking extent) caused by the dye may be determined based on the composition ratio of an acrylic-based photopolymerizable monomer and a photopolymerization initiator, which is described below, and accordingly the cross-linking extent may be controlled by adjusting the composition ratio of the acrylic-based photopolymerizable monomer and the photopolymerization initiator.

(B) Acrylic-Based Photopolymerizable Monomer

The acrylic-based photopolymerizable monomer may be any photopolymerizable monomer that may be included in a photosensitive resin composition.

Examples of the acrylic-based photopolymerizable monomer include without limitation ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenol-A diacrylate, trimethylolpropane triacrylate, novolac epoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like, and combinations thereof.

The acrylic-based photopolymerizable monomer may include a carboxyl group, which can react with a cyclic ether and thereby improve solvent-resistance. Examples of the acrylic-based photopolymerizable monomer including a carboxyl group may include without limitation esters of hydroxyl group-containing (meth)acrylate and carboxylic polyacid; esters of hydroxyl group-containing (meth)acrylate and carboxylic polyacid anhydride, and the like, and combinations thereof.

Examples of the hydroxyl group-containing (meth)acrylate include without limitation trimethylolpropane di(meth)acrylate, glycerine di(meth)acrylate, pentaerythritol tri(meth)acrylate, dipentaerythritol penta(meth)acrylate, and the like, and combinations thereof.

Examples of the carboxylic polyacid may include without limitation aromatic carboxylic polyacids such as phthalic acid, 3,4-dimethylphthalic acid, isophthalic acid, terephthalic acid, pyromellitic acid, trimellitic acid, 1,4,5,8-naphthalenetetracarboxylic acid, 3,3',4,4'-benzophenonetetracarboxylic acid, and the like; aliphatic carboxylic polyacids such as succinic acid, glutaric acid, sebacic acid, 1,2,3,4-butanetetracarboxylic acid, maleic acid, fumaric acid, itaconic acid, and the like; alicyclic carboxylic polyacids such as hexahydrophthalic acid, 3,4-dimethyltetrahydrophthalic acid, hexahydroisophthalic acid, hexahydroterephthalic acid, 1,2,4-cyclopentanetricarboxylic acid, 1,2,4-cyclohexanetricarboxylic acid, cyclopentanetetracarboxylic acid, 1,2,4,5-cyclohexane, tetracarboxylic acid, and the like; and the like and combinations thereof.

Examples of the carboxylic polyacid anhydride may include without limitation aromatic carboxylic polyacid anhydrides such as phthalic anhydride, pyromellitic anhydride, trimellitic anhydride, 3,3',4,4'-benzophenone tetracarboxylic acid dianhydride, and the like; aliphatic carboxylic polyacid anhydrides such as itaconic anhydride, succinic anhydride, citraconic anhydride, dodecenylsuccinic anhydride, tricarballylic anhydride, maleic anhydride, 1,2,3,4-butanetetracarboxylic acid dianhydride, and the like; alicyclic carboxylic polyacid anhydrides such as hexahydrophthalic acid, 3,4-dimethyl tetrahydrophthalic anhydride, 1,2,4-cyclopentane tricarboxylic acid anhydride, 1,2,4-cyclohexane tricarboxylic acid anhydride, cyclopentane tetracarboxylic acid dianhydride, 1,2,4,5-cyclohexane tetracarboxylic acid dianhydride, himic anhydride, nadic acid anhydride, and the like; carboxylic acid anhydrides including an ester group such as ethylene glycol bistrimellitate acid, glycerine tristrimelliatate anhydride, and the like; and the like, and combinations thereof.

Examples of the acrylic-based photopolymerizable monomer including the carboxyl group may include without limitation phthalic acid esters of trimethylol propane di(meth)acrylate, succinic acid esters of glycerine di(meth)acrylate, phthalic acid esters of pentaerythritol tri(meth)acrylate, succinic acid esters of pentaerythritol triacrylate, phthalic acid esters of dipentaerythritol penta(meth)acrylate, succinic acid esters of dipentaerythritol penta(meth)acrylate, and the like, and combinations thereof.

The photosensitive resin composition may include the acrylic-based photopolymerizable monomer in an amount of about 0.5 to about 20 wt %, for example about 1 to about 10 wt %, based on the total amount (total weight) of the photosensitive resin composition for a color filter. In some embodiments, the photosensitive resin composition may include the acrylic-based photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based photopolymerizable monomer can be in a range from about any of the foregoing amounts to about any other of the foregoing amounts.

When the acrylic-based photopolymerizable monomer is present in an amount within the above range, a pattern can be formed with clear edges and developability in an alkali developing solution can be excellent.

(C) Photopolymerization Initiator

Examples of the photopolymerization initiator may include without limitation triazine-based compounds, acetophenone-based compounds, biimidazole-based compounds, benzoin-based compounds, benzophenone-based compounds, thioxanthone-based compounds, oxime-based compounds, and the like, and combinations thereof.

Examples of the triazine-based compound may include without limitation 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, 2,4-bis(trichloromethyl)-6-piperonyl)-1,3,5-triazine, 2,4,6-trichloro-s-triazine, 2-phenyl-4,6-bis(trichloromethyl)-s-triazine, 2-(3',4'-dimethoxy styryl)-4,6-bis(trichloromethyl)-s-triazine, 2-(4'-methoxy naphthyl)-4,6-bis(trichloromethyl)-s-triazine, 2-(p-methoxy phenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxy naphtho-1-yl)-4,6-bis(trichloromethyl)-s-triazine, 2,3,4-trichloro methyl (piperonyl)-6-triazine, 2,3,4-trichloro methyl (4'-methoxy styryl)-6-triazine, and the like, and combinations thereof. In exemplary embodiments, 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, and/or 2,4-bis(trichloromethyl)-6-piperonyl-1,3,5-triazine may be used, for example, 2,4-bis(trichloromethyl)-6-piperonyl-1,3,5-triazine may be used.

Examples of the acetophenone-based compound may include without limitation diethoxyacetophenone, 2-methyl-2-morpholino-1-(4-methylthiophenyl)propan-1-one, 2-hydroxy-2-methyl-1-phenylpropan-1-one, benzyldimethylketal, 2-hydroxy-2-methyl-1-[4-(2-hydroxyethoxy)phenyl]propan-1-one, 1-hydroxycyclohexylphenylketone, 2-benzyl-2-dimethylamino-1-(4-morpholinophenyl)butan-1-one, 2-(4-methylbenzyl)-2-dimethylamino-1-(4-morpholinophenyl)butan-1-one, 2-hydroxy-2-methyl-1-[4-(1-methylvinyl)phenyl]propan-1-one, and the like, and combinations thereof. In exemplary embodiments, 2-methyl-2-morpholino-1-(4-methylthiophenyl)propan-1-one, 2-benzyl-2-dimethylamino-1-(4-morpholinophenyl)butan-1-one, and/or 2-(4-methylbenzyl)-2-dimethylamino-1-(4-morpholinophenyl)butan-1-one may be used, for example, 2-benzyl-2-dimethylamino-1-(4-morpholinophenyl)butan-1-one and/or 2-(4-methylbenzyl)-2-dimethylamino-1-(4-morpholinophenyl)butan-1-one may be used.

Examples of the biimidazole-based compound may include without limitation 2,2'-bis(2-chlorophenyl)-4,4',5,5'-tetraphenylbiimidazole, 2,2'-bis(2-chlorophenyl)-4,4',5,5'-tetra(4-carboethoxyphenyl)biimidazole, 2,2',-bis(2-chlorophenyl)-4,4',5,5'-tetra(4-bromophenyl)biimidazole, 2,2'-bis(2-chlorophenyl)-4,4',5,5'-tetra(2,4-dichlorophenyl)biimidazole, 2,2'-bis(2-bromophenyl)-4,4',5,5'-tetraphenylbiimidazole, 2,2'-bis(2,4-dichlorophenyl)-4,4',5,5'-tetraphenylbiimidazole, 2,2'-bis(2-chlorophenyl)-4,4',5,5'-tetra(m-methoxyphenyl)biimidazole, 2,2'-bis(2,3-dichlorophenyl)-4,4',5,5'-tetraphenylbiimidazole, 2,2'-bis(2,6-dichlorophenyl)-4,4',5,5'-tetraphenylbiimidazole, 2,2'-bis(2-nitrophenyl)-4,4',5,5'-tetraphenylbiimidazole, 2,2'-bis(2-methylphenyl)-4,4',5,5'-tetraphenylbiimidazole, and the like, and combination thereof. In exemplary embodiments, 2,2'-bis(2-chlorophenyl)-4,4',5,5'-tetraphenylbiimidazole and/or 2,2'-bis(2,3-dichlorophenyl)-4,4',5,5'-tetraphenylbiimidazole may be used.

Examples of the benzoin-based compound may include without limitation benzoin, benzoin methylether, benzoin ethylether, benzoin isopropylether, benzoin isobutylether, benzyldimethylketal, and the like, and combinations thereof.

Examples of the benzophenone-based compound may include without limitation benzophenone, benzoyl benzoate, o-benzoyl methyl benzoate, 4-phenyl benzophenone, hydroxy benzophenone, acrylated benzophenone, 3,3'-dimethyl-2-methoxy benzophenone, 4,4'-dichloro benzophenone, 4,4'-bis(dimethylamino)benzophenone, 4,4'-bis(diethylamino)benzophenone, 4-benzoyl-4'-methyldiphenylsulfide, 3,3',4,4'-tetra(tert-butylperoxycarbonyl)benzophenone, 2,4,6-trimethylbenzophenone, and the like, and combinations thereof.

Examples of the thioxanthone-based compound may include without limitation thioxanthone, 2-methyl thioxanthone, 2-isopropyl thioxanthone, 4-isopropyl thioxanthone, 2,4-diethyl thioxanthone, 2,4-diisopropyl thioxanthone, 2-chloro thioxanthone, 1-chloro-4-propoxythioxanthone, and the like, and combinations thereof.

Examples of the oxime-based compound may include without limitation O-acyloxime-based compounds, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like, and combinations thereof. Examples of the O-acyloxime-based compound may include without limitation 1-(4-phenylsulfanyl phenyl)-butane-1,2-dione 2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like, and combinations thereof.

Other examples of photopolymerization initiators that may be used may include without limitation carbazole-based compounds, diketone compounds, sulfonium borate-based compounds, diazo-based compounds, and the like, and combinations thereof.

The photopolymerization initiator absorbs light and is excited and then transmits energy. The photopolymerization initiator may be used with a photo-sensitizer causing a chemical reaction.

The photosensitive resin composition may include the photopolymerization initiator in an amount of about 0.1 wt % to about 20 wt %, for example about 0.5 to about 10 wt %, based on the total amount (total weight) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerization initiator can be in a range from about any of the foregoing amounts to about any other of the foregoing amounts.

When the photopolymerization initiator is included in an amount within the above range, it may bring about sufficient photopolymerization in the patterning process, with minimal or no deterioration of transmittance due to non-reacting initiator remnants.

(D) Acrylic-Based Binder Resin

The acrylic-based binder resin is a copolymer of a first ethylenic unsaturated monomer and a second ethylenic unsaturated monomer that is copolymerizable therewith, and is a resin that includes at least one acrylic-based repeating unit.

The first ethylenic unsaturated monomer is an ethylenic unsaturated monomer including at least one carboxyl group. Examples of the first ethylenic unsaturated monomer include without limitation acrylic acid, methacrylic acid, maleic acid, itaconic acid, fumaric acid, and the like, and combinations thereof.

The acrylic-based binder resin may include the first ethylenic unsaturated monomer in an amount ranging from about 5 to about 50 wt %, for example from about 10 to about 40 wt %, based on the total amount (total weight) of the acrylic-based binder resin. In some embodiments, the acrylic-based binder resin may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyl toluene, vinylbenzylmethylether and the like; unsaturated carboxylate ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl (meth)acrylate, phenyl(meth)acrylate, and the like; unsaturated carboxylic acid amino alkyl ester compounds such as 2-aminoethyl(meth)acrylate, 2-dimethylaminoethyl(meth) acrylate, and the like; carboxylic acid vinyl ester compounds such as vinyl acetate, vinyl benzoate, and the like; unsaturated carboxylic acid glycidyl ester compounds such as glycidyl (meth)acrylate, and the like; vinyl cyanide compounds such as (meth)acrylonitrile and the like; unsaturated amide compounds such as (meth)acrylamide, and the like; and the like, and may be used singularly or as a mixture of two or more.

Specific examples of the acrylic-based binder resin may include without limitation a methacrylic acid/benzylmethacrylate copolymer, a methacrylic acid/benzyl methacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like. These may be used singularly or as a mixture of two or more.

The acrylic-based resin may have a weight average molecular weight of about 3,000 to about 150,000 g/mol, for example about 5,000 to about 50,000 g/mol. When the acrylic-based resin has a weight average molecular weight within the above range, the photosensitive resin composition for a color filter can have excellent physical and chemical properties, can have an appropriate viscosity, and can have improved close contacting (adhesive) property during manufacture of a color filter.

The acrylic-based resin may have an acid value ranging from about 15 to about 60 mgKOH/g, for example about 20 to about 50 mgKOH/g. When the acrylic-based resin has an acid value within the above range, excellent pixel resolution may be obtained.

The photosensitive resin composition may include the acrylic-based binder resin in an amount of about 0.5 to about 20 wt %, for example about 1 to about 15 wt %, based on the total amount (total weight) of the photosensitive resin composition. In some embodiments, the photosensitive resin composition may include the acrylic-based binder resin in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range, developability during manufacture of a color filter can be improved and excellent surface smoothness due to cross-linking improvement may be obtained.

(E) Solvent

The solvent is required to have compatibility with the acrylic-based binder resin and other component materials, but does not have a reaction therewith.

The solvent is not particularly limited. Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; ketone acid esters such as ethyl pyruvate, and the like, N-methylformamide, N,N-dimethylformamide, N-methylformanilide, N-methylacetamide, N,N-dimethylacetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like. The solvent may be used singularly or as a mixture of two or more.

The photosensitive resin composition may include the solvent in a balance amount, for example, in an amount ranging from about 20 to about 90 wt %, based on the total weight of the photosensitive resin composition. In some embodiments, the photosensitive resin composition can include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition can have improved coating properties and excellent flatness at a thickness of about 1 µm or more.

(F) Colorant

The photosensitive resin composition may further include a colorant other than (in addition to) the dye including the cation moiety represented by the above Chemical Formula 1 to realize color characteristics.

The colorant may include a pigment, a dye, or a combination thereof. When a pigment and a dye are used as a hybrid type colorant, a problem caused by excessively using a pigment, for example, lighting sensitivity deterioration, pattern-tearing off, pattern linearity, residue, and the like may be improved.

The pigment may have colors of red, green, blue, yellow, violet, and the like. Examples of the pigment may include without limitation condensed polycyclic pigments such as anthraquinone-based pigments, perylene-based pigments and the like, phthalocyanine-based pigments, azo-based pigments, and the like. They may be used as singularly or in combination of two or more. A combination of two or more pigments may be used to adjust maximum absorption wavelength, cross point, crosstalk, and the like.

The pigment may be included in a photosensitive resin composition for a color filter as a pigment dispersion solution.

In addition, the pigment may include a dispersing agent, so that the pigment component can be uniformly dispersed. The dispersing agent can include any nonionic, anionic, and/or cationic dispersing agents. Examples of the dispersing agent may include without limitation polyalkylene glycols and esters thereof, polyoxyalkylenes, polyhydric alcohol ester alkylene oxide additives, alcohol alkyleneoxide additives, sulfonate esters, sulfonic acid salts, carboxylic acid esters, carboxylic acid salts, alkylamide alkylene oxide additives, alkylamines, and the like. These dispersing agents may be used singularly or in a combination of two or more.

In addition, the first carboxyl-containing acrylic-based resin as well as the dispersing agent may be additionally used in order to improve pixel patterning properties as well as stability of a pigment dispersion solution.

The pigment can have a primary particle diameter ranging from about 10 to about 80 nm, for example about 10 to about 70 nm. When the pigment has a primary particle diameter within the above range, it can have excellent stability in a dispersion solution but may not deteriorate resolution of pixels.

Examples of the dye may include without limitation anthraquinone-based compounds, cyanine-based compounds, mesocyanine-based compounds, azaporphyrin-based compounds, phthalocyanine-based compounds, pyrrolopyrrole-based compounds, diazo-based compounds, carbonium-based compounds, acridine-based compounds, thiazole-based compounds, quinomine-based compounds, methine-based compounds, quinoline-based compounds, and the like, and combinations thereof.

When the dispersion including the pigment and dye is used, the pigment and dye may be present at a ratio of about 1:9 to about 9:1. Within the above range, the composition may realize high luminance and contrast ratio and realize desired color characteristics.

The photosensitive resin composition may include the colorant in an amount of about 0.1 to about 40 wt %, for example about 1 to about 25 wt %, based on the total amount (total weight) of the photosensitive resin composition for a color filter. In some embodiments, the photosensitive resin composition can include the colorant in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 4020, 21, 22, 23, 24, 25, 26, 27, 28, 29, 30, 31, 32, 33, 34, 35, 36, 37, 38, 39, or 40 wt %. Further, according to some embodiments of the present invention, the amount of the colorant can be in a range from about any of the foregoing amounts to about any other of the foregoing amounts.

When the colorant is included in an amount within the above range, coloring properties and developability can be improved.

(G) Other Additive(s)

The photosensitive resin composition for a color filter may further include one or more other additives. Examples of the additives may include without limitation dispersing agents as described above other than the (A) to (F) components, so that the component such as the colorant (F) may be uniformly dispersed in a solvent (D).

Examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkyl amide alkylene oxide addition products, alkylamines, and the like. These may be used singularly or in a mixture of two or more.

The dispersing agent may be included in an amount of about 10 to about 20 parts by weight based on about 100 parts by weight of the colorant (F).

The photosensitive resin composition for a color filter may further include one or more additives such as but not limited to epoxy compounds; malonic acid; 3-amino-1,2-propanediol; silane-based coupling agents with a vinyl group and/or a (meth)acryloxy group; leveling agents; silicone-based surfactants; fluorine-based surfactants; radical polymerization initiators, and the like, and combinations thereof, in order to prevent staining or spotting during the coating, to prevent generation of a residue due to non-development, and/or to control leveling.

Examples of the epoxy compound may include without limitation phenol novolac epoxy compounds, tetramethyl biphenyl epoxy compounds, bisphenol A epoxy compounds, alicyclic epoxy compounds, and the like, and combinations thereof.

The epoxy compound may be included in an amount of about 0.01 wt % to about 10 wt % based the total amount (total weight) of the photosensitive resin composition for a color filter. When the epoxy compound is used in an amount within the above range, storage and process margin may be improved.

Examples of the silane-based coupling agent may include without limitation vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like, and combinations thereof.

The silane-based coupling agent may be included in an amount of about 0.01 wt % to about 2 wt % based on the total weight of the photosensitive resin composition for a color filter. When the silane-based coupling agent is used in an amount within the above range, adherence, storage stability, and coating properties may be improved.

The silicone-based surfactant may include a surfactant including a siloxane bond, and the like. Examples of the silicone-based surfactant may include without limitation DC3PA, SH7PA, DC11PA, SH21PA, SH28PA, 29SHPA, and SH30PA of TORAY SILICONE CO., LTD.; polyester-modified silicone oil, SH8400 of TORAY SILICONE CO., LTD; KP321, KP322, KP323, KP324, KP326, KP340, and GF of SHIN ETSU SILICONE CO., LTD.; TSF4445, TSF4446, TSF4452, and TSF4460 of TOSHIBA SILICONE CO., LTD.; and the like, and combinations thereof.

The fluorine-based surfactant may be a surfactant having a fluorocarbon backbone, and the like. Examples of the fluorine-based surfactant may include without limitation FULO- RAD FC430 and FULORAD FC431 of SUMITOMO 3M CO., LTD.; MEGAFACE F142D, MEGAFACE F171, MEGAFACE F172, MEGAFACE F173, MEGAFACE F177, MEGAFACE F183, MEGAFACE F470, MEGAFACE F475, and MEGAFACE R30 of DAINIPPON INK KAGAKU KOGYO CO., LTD.; EFTOP EF301, EFTOP EF303, EFTOP EF351, and EFTOP EF352 of TOCHEM RODUCTS, CO., LTD.; SURFLON S381, SURFLON S382, SURFLON SC101, and SURFLON SC105 of ASAHI GLASS CO., LTD.; E5844 of DIKIN Fine Chemical Laboratory; and the like, and combinations thereof.

The silicone-based surfactant and fluorine-based surfactant may be used singularly or as a mixture of two or more.

According to another embodiment of the present invention, a color filter manufactured using the photosensitive resin composition for a color filter is provided.

An exemplary method of manufacturing the color filter is as follows.

The photosensitive resin composition for a color filter may be coated to a thickness of about 3.1 µm to about 3.4 µm using a suitable method such as a spin-coating, slit-coating, and the like on a bare glass substrate or a glass substrate on which $SiN_x$ (protective layer) is coated to a thickness of about 500 Å to about 1500 Å. After coating, the coated layer can be radiated with light (for example, UV ray, electron beam or X ray in about 190 nm to about 450 nm, for example about 200 nm to about 400 nm region) to form a pattern required for a color filter. After radiating, the coated layer can be treated with an alkali developing solution, and the non-radiated region thereof may be dissolved, forming a pattern for an image color filter. This process can be repeated depending on the necessary number of R, G, and B colors, to thereby fabricate a color filter having a desired pattern. In addition, the image pattern acquired by the development can be cured through heat treatment, actinic ray radiation, or the like, which can improve crack resistance, solvent resistance, and the like.

Hereinafter, the present invention is illustrated in more detail with reference to the following examples. These examples, however, are not in any sense to be interpreted as limiting the scope of the invention.

(Dye Synthesis)

Synthesis Example 1

Step 1:

218 g of 4,4'-difluorobenzophenone (Aldrich Corporation), 420 g of diethanol amine (Aldrich Corporation), and 1 L of DMSO (Aldrich Corporation) are put in a flask equipped with a cooling tube and an agitator and agitated under a nitrogen stream at 140° C. for 2.5 hours. The reaction solution is cooled down to room temperature and put into about 10 L of water for precipitation. The solid produced therein is filtered, sufficiently washed, and dried under a reduced pressure, obtaining an intermediate represented by Chemical Formula 9.

[Chemical Formula 9]

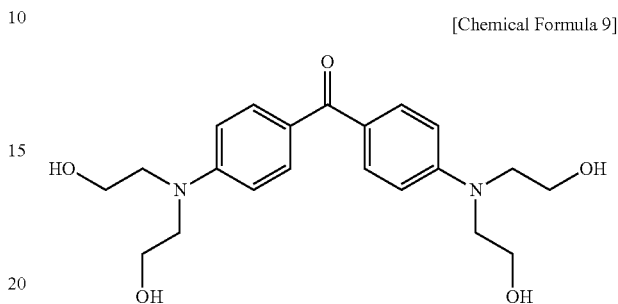

Step 2:

100 g of the intermediate represented by the above Chemical Formula 9 and 160 g of 2-isocyanatoethyl methacrylate (Showa Denko Carbon Inc.) are agitated with 0.5 L of dichloromethane in a flask equipped with a cooling tube and an agitator. 0.1 g of dibutyl tin dilaurylate (Aldrich Corporation) is added to the mixture, and the resulting mixture is agitated at 40° C. for 12 hours. The resultant is cooled down to room temperature and distilled under a reduced pressure, obtaining an intermediate represented by the following Chemical Formula 10.

[Chemical Formula 10]

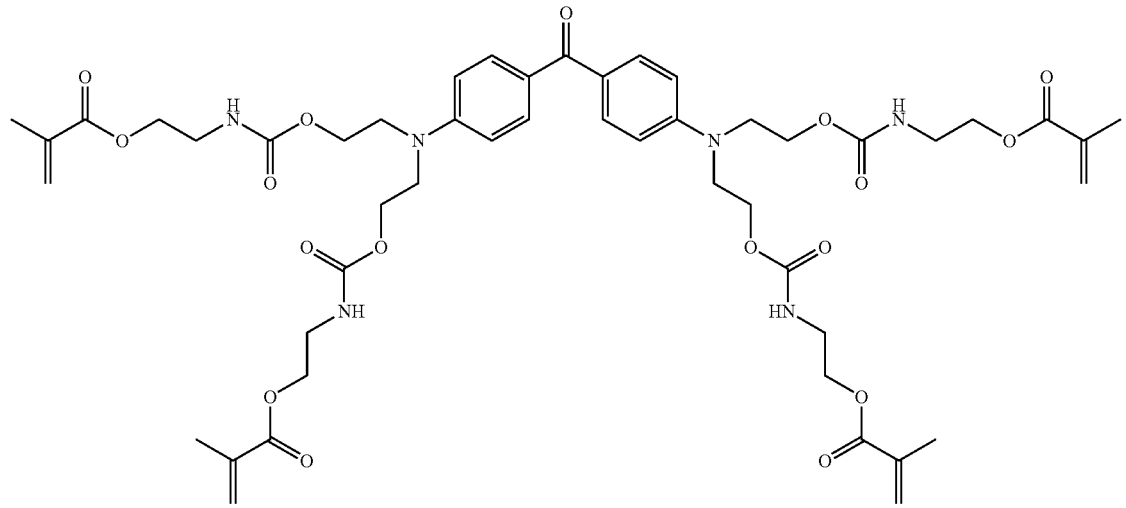

Step 3:

182 g of the intermediate represented by the above Chemical Formula 10 and 28 g of N-methylnaphthylamine (Aldrich Corporation) are agitated with 2.5 L of toluene in a flask equipped with a cooling tube and an agitator. 27 g of phosphoryl chloride (Aldrich Corporation) is added to the mixture at room temperature, and the resulting mixture is agitated at 85° C. for 5.5 hours. The resultant is cooled down to room temperature, 100 g of ethanol is added thereto, and the mixture is filtered and dried, obtaining a dye represented by the following Chemical Formula 11.

[Chemical Formula 11]

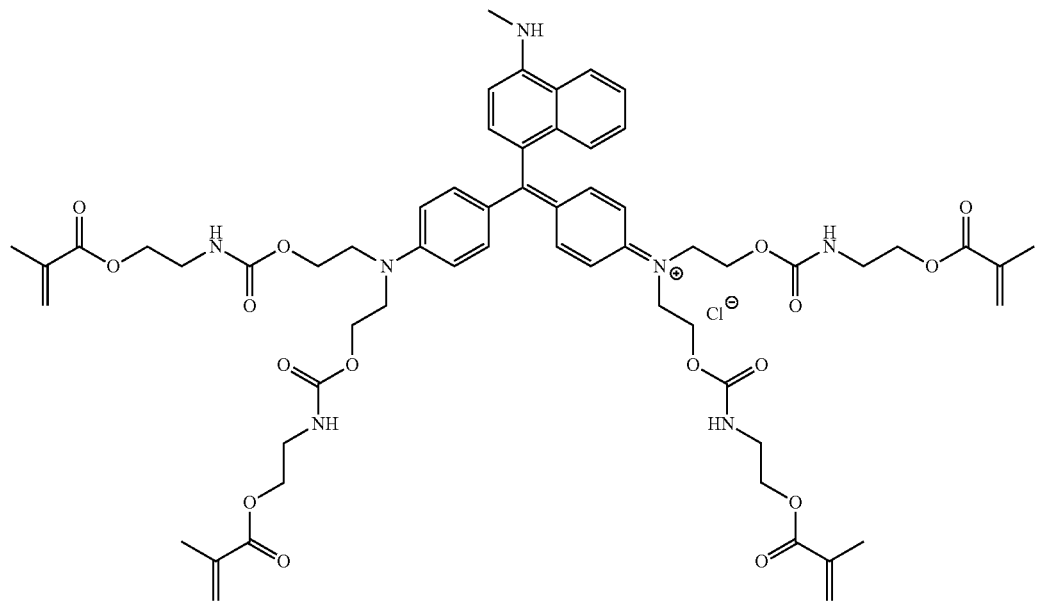

Synthesis Example 2

Step 1:
100 g of N-(2-hydroxyethyl)naphthyl amine (ABI Chem) and 55 g of triethylamine (Aldrich Corporation) are dissolved in 1 L of dichloromethane (Aldrich Corporation) in a flask equipped with a cooling tube and an agitator and cooled down to 3° C., 59 g of methacryloyl chloride (Aldrich Corporation) is added thereto in a dropwise fashion for 2 hours while agitated, the mixture is heated up to 40° C. and agitated for 3 hours, and cooled down to room temperature, a salt produced therein is filtered and removed, and the filtered solution is distilled under a reduced pressure, obtaining an intermediate represented by the following Chemical Formula 12.

[Chemical Formula 12]

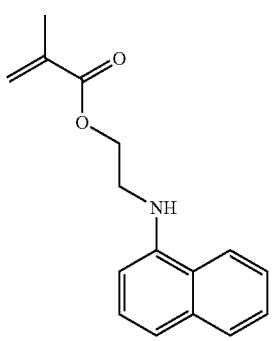

Step 2:
50 g of the intermediate represented by the above Chemical Formula 12 and 198 g of the intermediate represented by the above Chemical Formula 10 are put in 2 L of toluene (Aldrich Corporation) in a flask equipped with a cooling tube and an agitator and agitated, 30 g of phosphoryl chloride (Aldrich Corporation) is added thereto at room temperature, and the mixture is agitated at 85° C. for 5.5 hours. The reaction solution is cooled down to room temperature, 150 g of ethanol is added thereto, and the resultant is filtered and dried, obtaining a dye represented by the following Chemical Formula 13.

[Chemical Formula 13]

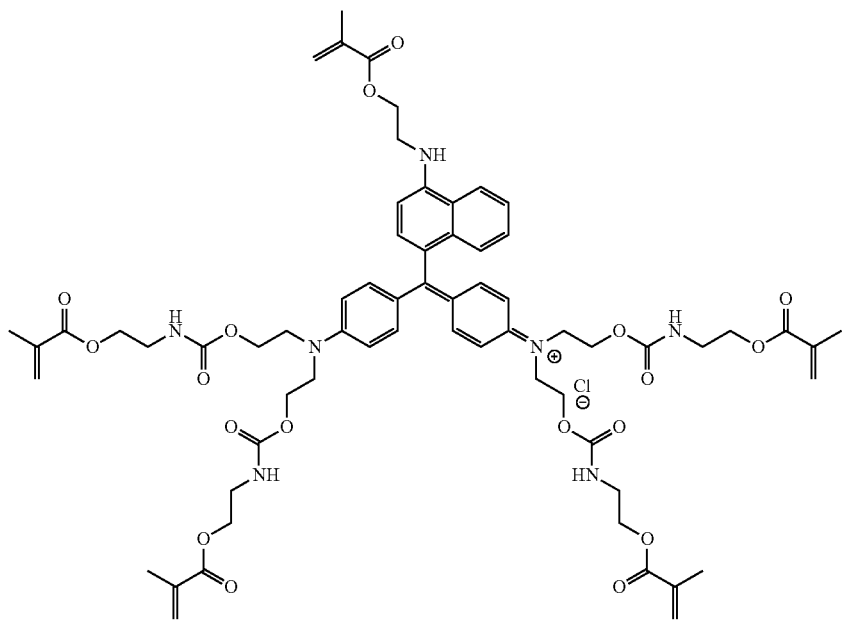

Synthesis Example 3

58.4 g of 4,4'-bis(diethylamino)benzophenone (Acros Inc.), 28 g of N-methylnaphthylamine (Aldrich Corporation), and 1 L of toluene are mixed in a flask equipped with a cooling tube and an agitator. 27 g of phosphoryl chloride (Aldrich Corporation) is added to the mixture at room temperature, and the resulting mixture is agitated at 85° C. for 5.5 hours. The resultant is cooled down to room temperature, 100 g of ethanol is added thereto, and the obtained mixture is filtered and dried, obtaining a dye represented by the following Chemical Formula 14.

[Chemical Formula 14]

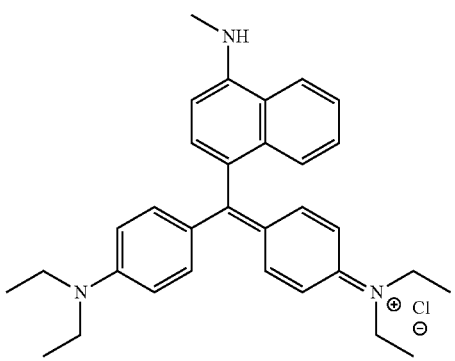

(Preparation of Photosensitive Resin Composition for Color Filter)

Examples 1 to 3

A photosensitive resin composition is prepared by using the following components to have the following compositions as provided in the following Tables 1 to 3. First of all, a photopolymerization initiator is dissolved in a solvent, and the solution is agitated at room temperature for 2 hours. Subsequently, the dyes (Chemical Formulas 11 and 13) according to Synthesis Examples 1 and 2, an acrylic-based photopolymerizable monomer, and an acrylic-based binder resin are added thereto, and the resulting mixture is agitated at room temperature for 2 hours. Then, a pigment dispersion is added to the resultant, and the mixture is agitated at room temperature for one hour, preparing a photosensitive dye composition for a color filter according to the present invention. The solution is three times filtered to remove impurities. The components used to prepare the photosensitive resin compositions according to Examples 1 to 3 are provided in the following Tables 1 to 3.

TABLE 1

| (Example 1) | |
|---|---|
| Composition | Amount (g) |
| Dye | 6.0 |
| (Chemical Formula 11 of Synthesis Example 1) | |
| Acrylic-based photopolymerizable monomer | 8.0 |
| (dipentaerythritol hexaacrylate, DPHA) | |
| Photopolymerization initiator | 0.2 |
| (IGACURE OXE2 (Ciba Specialty Chemicals)) | |
| Acrylic-based binder resin (CPR-200H (SMS)) | 10.0 |
| Solvent (PGMEA) | 25.0 |
| Additive (F-475 (DIC Co., Ltd., fluorine-based surfactant)) | 0.1 |

TABLE 2

| (Example 2) | |
|---|---|
| Composition | Amount (g) |
| Dye (Chemical Formula 11 of Synthesis Example 1) | 3.0 |
| Acrylic-based photopolymerizable monomer | 4.1 |
| (dipentaerythritol hexaacrylate, DPHA) | |
| Photopolymerization initiator | 0.2 |
| (IGACURE OXE2, Ciba Specialty Chemicals) | |
| Pigment dispersion | 20.5 |
| (Heliogen Blue R 6700F (blue pigment, BASF)) | 4.5 |
| (BYK21208 (a dispersing agent, BYK)) | 1.2 |

TABLE 2-continued (Example 2)

| Composition | Amount (g) |
|---|---|
| (CPR-200H (an acryl-based binder resin, SMS)) | 0.8 |
| (PGMEA, solvent) | 14.0 |
| Acrylic-based binder resin (CPR-200H, SMS) | 4.0 |
| Solvent (PGMEA) | 24.0 |
| Additive (F-475 (fluorine-based surfactant, DIC Co., Ltd.) | 0.1 |

TABLE 3

(Example 3)

| Composition | Amount (g) |
|---|---|
| Dye (Chemical Formula 13 of Synthesis Example 2) | 6.0 |
| Acrylic-based photopolymerizable monomer (dipentaerythritol hexaacrylate, DPHA) | 8.0 |
| Photopolymerization initiator (IGACURE OXE2 (Ciba Specialty Chemicals Co.)) | 0.2 |
| Acrylic-based binder resin (CPR-200H (SMS)) | 10.0 |
| Solvent (PGMEA) | 25.0 |
| Additive (fluorine-based surfactant (F-475, DIC Co., Ltd.)) | 0.1 |

Comparative Example 1

A photosensitive resin composition for a color filter is prepared according to the same method as Examples 1 to 3 except for using only a pigment dispersion without using a dye. The components used to prepare the photosensitive resin composition according to Comparative Example 1 are provided in the following Table 4.

TABLE 4

| Composition | Amount (g) |
|---|---|
| Acrylic-based photopolymerizable monomer (dipentaerythritol hexaacrylate, DPHA) | 4.1 |
| Photopolymerization initiator (IGACURE OXE2 (Ciba Specialty Chemicals)) | 0.2 |
| Pigment dispersion | 62.0 |
| (Heliogen Blue R 6700F (BASF, blue pigment)) | 10.5 |
| (BYK21208 (BYK, a dispersing agent)) | 3.5 |
| (CPR-200H (SMS, acryl-based binder resin)) | 3.0 |
| (PGMEA, solvent) | 45.0 |
| Acrylic-based binder resin (CPR-200H (SMS)) | 4.0 |
| Solvent (PGMEA) | 30.0 |
| Additive (F-475 (DIC Co., Ltd., fluorine-based surfactant)) | 0.1 |

Comparative Example 2

A photosensitive composition for a color filter is prepared according to the same method as Examples 1 to 3 except for using a dye (Chemical Formula 14) according to Synthesis Example 3 instead of the dyes (Chemical Formulas 11 and 13) according to Synthesis Examples 1 and 2. The components used to prepare the photosensitive resin composition according to Comparative Example 2 are provided in the following Table 5.

TABLE 5

| Composition | Amount (g) |
|---|---|
| Dye (Chemical Formula 14 of Synthesis Example 3) | 6.0 |
| Acrylic-based photopolymerizable monomer (dipentaerythritol hexaacrylate, DPHA) | 8.0 |

TABLE 5-continued

| Composition | Amount (g) |
|---|---|
| Photopolymerization initiator (IGACURE OXE2 (Ciba Specialty Chemicals)) | 0.2 |
| Acrylic-based binder resin (CPR-200H (SMS)) | 10.0 |
| Solvent (PGMEA) | 25.0 |
| Additive (a fluorine-based surfactant (F-475, DIC Co., Ltd.)) | 0.1 |

(Formation of Color Filter Pattern)

Each photosensitive resin composition according to Examples 1 to 3 and Comparative Examples 1 and 2 is respectively coated to be 3 μm thick on a circular bare transparent glass substrate (bare glass) by using a spin-coater (K-Spin8, KDNS). The coated glass substrate is soft-baked on a 80° C. hot-plate for 150 seconds and exposed to light with 60 mJ of power output by using an exposer (I10C, Nikon Corp.), developed by using a potassium hydroxide aqueous solution in a concentration of 1 wt % at 25° C., for 60 seconds, washed for 60 seconds, and spin-dried for 25 seconds, forming a plurality of color filter patterns.

Evaluation 1: Evaluation of Stripper Resistance

Each of the color filter patterns formed by using the photosensitive resin compositions according to Examples 1 to 3 and Comparative Examples 1 and 2 is hard-baked in a 200° C. oven for 30 minutes and dipped in a 70° C. stripper (PRS-2000, J.T. Baker Inc.) for 40 minutes, and then, washed with deionized water (DIW) and dried. Color change and luminance of the specimens are evaluated by using a spectrophotometer (MCPD3000, Otsuka Electronics Inc.), and the results are provided in the following Table 6.

Evaluation 2: Evaluation of Heat Resistance

The color filter patterns formed by using the photosensitive resin compositions according to Examples 1 to 3 and Comparative Examples 1 and 2 are hard-baked in a 230° C. oven for 30 minutes, and then, their color change and luminance are measured by using a spectrophotometer (MCPD3000, Otsuka Electronics Co.), and the color filter patterns are baked in a 230° C. oven for 2 hours again, and then, their color change and luminance are measured again. The results are provided in the following Table 6.

TABLE 6

| | Color changes | | Luminance | |
|---|---|---|---|---|
| | ΔE after stripper evaluation | ΔE after heat resistance evaluation | Luminance after stripper evaluation | Luminance after heat resistance evaluation |
| Example 1 | 1.31 | 2.13 | 18.5 | 19.1 |
| Example 2 | 1.26 | 2.05 | 16.8 | 17.1 |
| Example 3 | 1.21 | 2.11 | 18.3 | 18.8 |
| Comparative Example 1 | 1.19 | 2.16 | 13.4 | 13.1 |
| Comparative Example 2 | 24.2 | 11.5 | 9.5 | 11.2 |

As shown in Table 6, Examples 1 to 3, respectively, using dyes represented by Chemical Formulas 11 and 13 show small color change and high luminance in the stripper and heat resistance evaluations. In contrast, Comparative Example 1 using only a pigment show small color change but low luminance after the stripper and heat resistance evaluations, and Comparative Example 2 using a dye represented by Chemical Formula 14 show severe color change and low luminance after stripper and heat resistance evaluations, since the dye had the same chromophoric group as the Examples of the invention but no double bond.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising:
   (A) a dye including a cation moiety represented by the following Chemical Formula 1;
   (B) an acrylic-based photopolymerizable monomer;
   (C) a photopolymerization initiator;
   (D) an acrylic-based binder resin; and
   (E) a solvent:

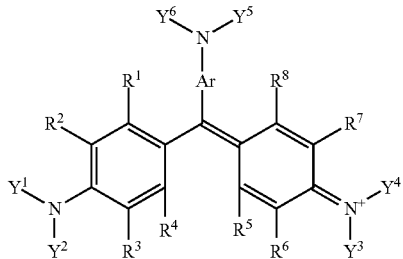

[Chemical Formula 1]

wherein, in the above Chemical Formula 1,
$R^1$ to $R^8$ are the same or different and are each independently hydrogen, halogen, a nitrile group, a nitro group, a substituted or unsubstituted amine group, substituted or unsubstituted C1 to C30 alkyl, substituted or unsubstituted C3 to C30 cycloalkyl, or substituted or unsubstituted C6 to C30 aryl,
Ar is substituted or unsubstituted C6 to C30 arylene,
$Y^1$ to $Y^6$ are the same or different and are each independently hydrogen, substituted or unsubstituted acrylate, substituted or unsubstituted C1 to C30 alkyl, substituted or unsubstituted C3 to C30 cycloalkyl, substituted or unsubstituted C2 to C30 heterocycloalkyl, substituted or unsubstituted C6 to C30 aryl, or substituted or unsubstituted C2 to C30 heteroaryl,
wherein at least one of $Y^1$ to $Y^6$ is represented by the following Chemical Formula 2,

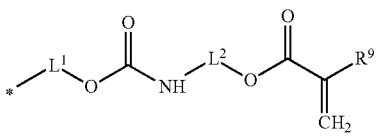

[Chemical Formula 2]

wherein, in the above Chemical Formula 2,
$L^1$ and $L^2$ are the same or different and are each independently substituted or unsubstituted C1 to C30 alkylene, substituted or unsubstituted C3 to C30 cycloalkylene, or substituted or unsubstituted C6 to C30 arylene, and
$R^9$ is hydrogen or substituted or unsubstituted C1 to C30 alkyl.

2. The photosensitive resin composition for a color filter of claim 1, wherein at least one of the $Y^1$ to $Y^6$ is represented by the following Chemical Formula 3 in addition to the above Chemical Formula 2:

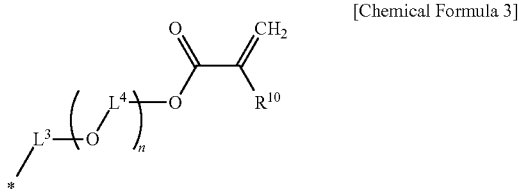

[Chemical Formula 3]

wherein, in the above Chemical Formula 3,
$L^3$ and $L^4$ are the same or different and are each independently substituted or unsubstituted C1 to C30 alkylene, substituted or unsubstituted C3 to C30 cycloalkylene, or substituted or unsubstituted C6 to C30 arylene,
$R^{10}$ is hydrogen or substituted or unsubstituted C1 to C30 alkyl, and
n is an integer ranging from 0 to 20.

3. The photosensitive resin composition for a color filter of claim 2, wherein at least two of the $Y^1$ to $Y^6$ are selected from the above Chemical Formula 2 and the above Chemical Formula 3, with the proviso that at least one of the $Y^1$ to $Y^6$ is represented by the above Chemical Formula 2.

4. The photosensitive resin composition for a color filter of claim 1, wherein the dye including the cation moiety represented by the above Chemical Formula 1 is a dye including a cation moiety represented by the following Chemical Formula 4:

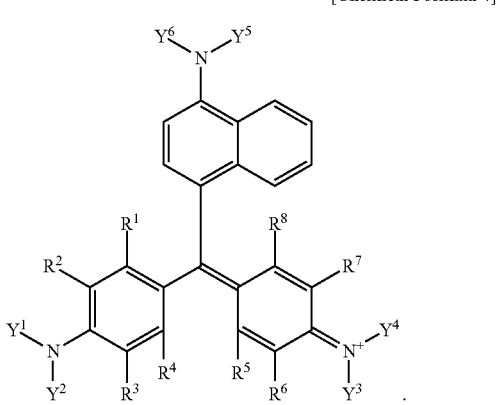

[Chemical Formula 4]

5. The photosensitive resin composition for a color filter of claim 1, wherein the dye including the cation moiety represented by the above Chemical Formula 1 is a dye including a cation moiety represented by the following Chemical Formula 5:

[Chemical Formula 5]

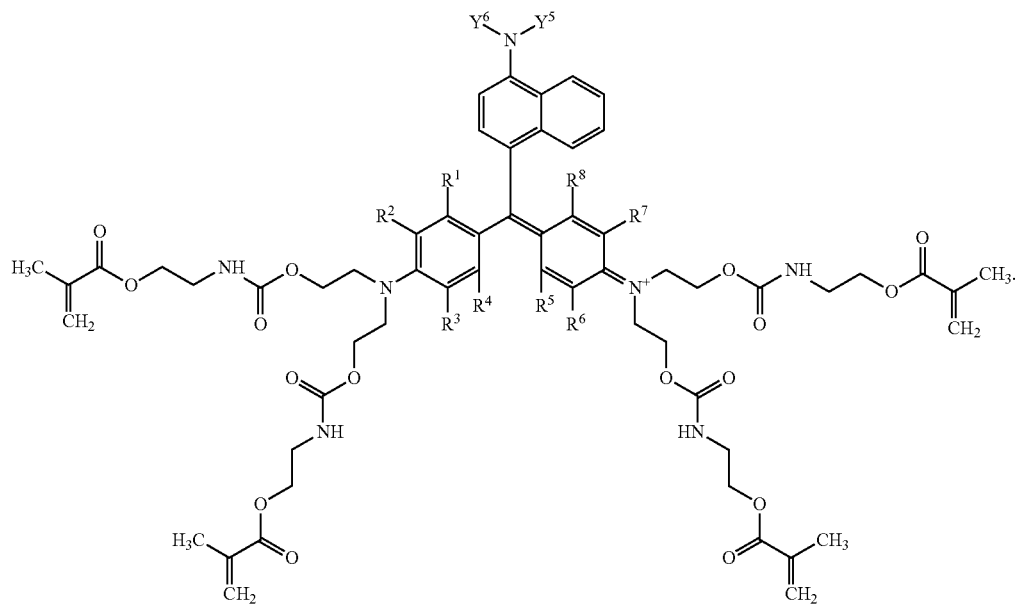

6. The photosensitive resin composition for a color filter of claim 1, wherein the photosensitive resin composition for a color filter comprises:
   0.1 wt % to about 50 wt % dye including the cation moiety represented by the above Chemical Formula 1 (A);
   about 0.5 wt % to about 20 wt % of the acrylic-based photopolymerizable monomer (B);
   about 0.1 to about 10 wt % of the photopolymerization initiator (C);
   about 0.5 wt % to about 20 wt % of the acrylic-based binder resin (D); and
   a balance amount of the solvent (E).

7. The photosensitive resin composition for a color filter of claim 1, wherein the photosensitive resin composition for a color filter further comprises at least one colorant (F) comprising a dye, a pigment, or a combination thereof wherein the dye is different than the dye including the cation moiety represented by the above Chemical Formula 1.

8. The photosensitive resin composition for a color filter of claim 7, wherein the colorant (F) is included in an amount of about 0.1 wt % to about 40 wt % based on total weight of the photosensitive resin composition for a color filter.

9. The photosensitive resin composition for a color filter of claim 1, wherein the photosensitive resin composition for a color filter further comprises malonic acid; 3-amino-1,2-propanediol; a coupling agent including a vinyl group; a coupling agent including a vinyl group a (meth)acryloxy group; a leveling agent; a fluorine-based surfactant; a radical polymerization initiator; or a combination thereof.

10. A color filter manufactured using the photosensitive resin composition for a color filter of claim 1.

* * * * *